(12) United States Patent
Desortiaux

(10) Patent No.: US 6,853,253 B2
(45) Date of Patent: Feb. 8, 2005

(54) LOAD PUMP WITH AN EXTREMELY WIDE OUTPUT VOLTAGE

(75) Inventor: Vincent Desortiaux, Bois Colombes (FR)

(73) Assignee: Alcatel, Paris (FR)

( * ) Notice: Subject to any disclaimer, the term of this patent is extended or adjusted under 35 U.S.C. 154(b) by 169 days.

(21) Appl. No.: 10/330,134

(22) Filed: Dec. 30, 2002

(65) Prior Publication Data

US 2003/0122626 A1 Jul. 3, 2003

(30) Foreign Application Priority Data

Jan. 3, 2002 (FR) .......................................... 02 00034

(51) Int. Cl.[7] .............................................. H03L 7/06
(52) U.S. Cl. ...................... 331/16; 327/157; 327/546; 331/17; 331/25
(58) Field of Search ............................. 331/16, 17, 25; 327/157, 536, 148, 543

(56) References Cited

U.S. PATENT DOCUMENTS

| 5,760,640 A | * | 6/1998 | Girard et al. ................ 327/543 |
| 6,107,889 A | * | 8/2000 | Strange et al. ................ 331/17 |
| 6,124,755 A |   | 9/2000 | Parker et al. |
| 6,611,161 B1 | * | 8/2003 | Kumar et al. ................ 327/157 |
| 2002/0175723 A1 | * | 11/2002 | Ruegg et al. ................ 327/157 |

FOREIGN PATENT DOCUMENTS

EP          0778510 A1    6/1997

* cited by examiner

*Primary Examiner*—Robert Pascal
*Assistant Examiner*—Joseph Chang
(74) *Attorney, Agent, or Firm*—Sughrue Mion, PLLC

(57) ABSTRACT

The invention concerns a load pump device able to provide a constant current, respectively positive or negative, over an extremely wide output voltage range. A symmetrical switching system activates a first operational amplifier (AOP1) associated with the positive current source or a second amplifier (AOP2) associated with the negative current source according to predetermined threshold values (Vref), the first amplifier being provided so as to restore the behavior of the current mirror (M2, M1) generating a positive current when the output voltage of the device approaches the feed voltage (VDD) and the second amplifier being provided so as to restore the behavior of the current mirror (M4, M3) generating a negative current when the output voltage of the device approaches the earth (GND), thus allowing the output current of the device to be always constant and equal to a reference value (Iref).

5 Claims, 1 Drawing Sheet

LOAD PUMP WITH AN EXTREMELY WIDE OUTPUT VOLTAGE

FIELD OF THE INVENTION

Figure 1:
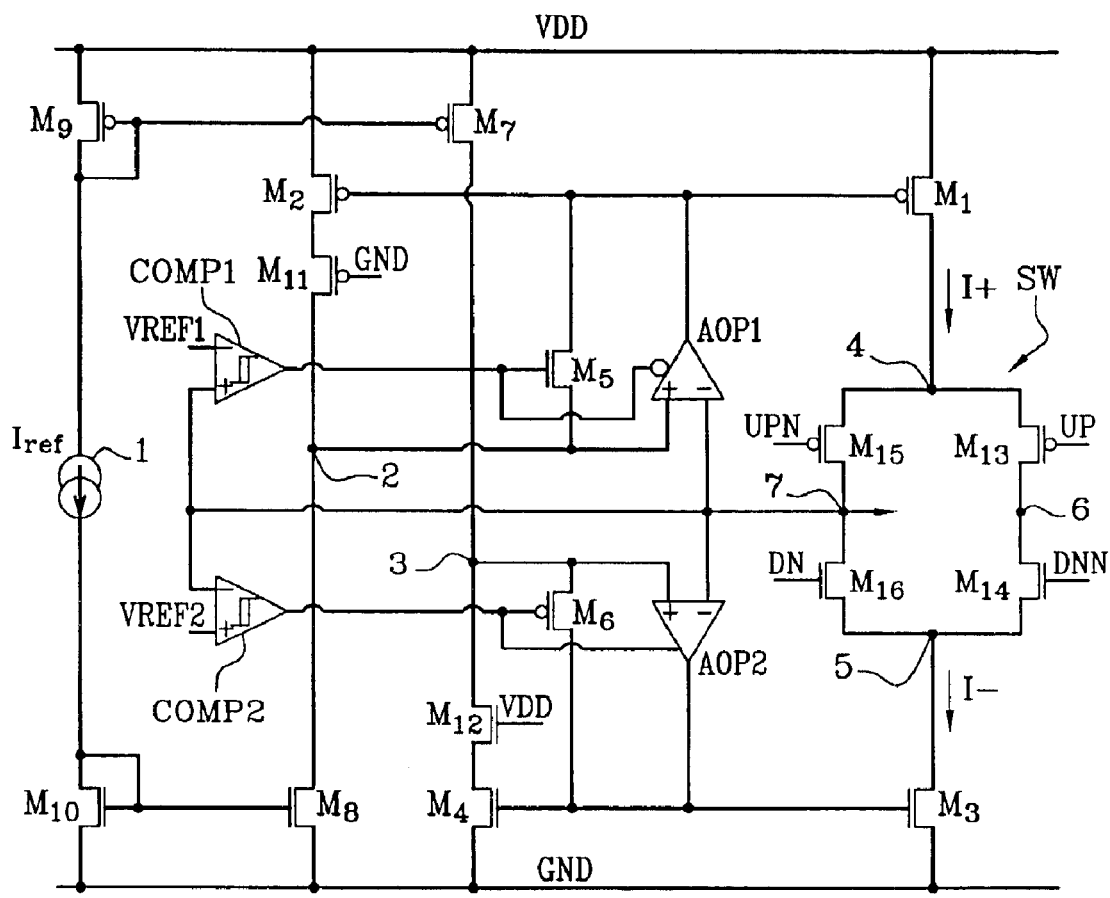

The present invention concerns a load pump able to function with an extremely wide output voltage range spread between the ground and the mains voltage.

This load pump of the invention is in particular able to maximise the adjustment range of a voltage-controlled oscillator of an automatic control phase loop and thus can be advantageously applied in radioelectric transmission systems.

BACKGROUND OF THE INVENTION

A load pump is a device normally used in automatic control phase loops and is more specifically placed between the phase comparator and the loop filter. The automatic control phase loop or PLL ("phase locked loop") in fact denotes an assembly formed of an automatic controlled phase oscillator and the associated phase comparator and filter.

The phase automatic controlled oscillator is provided to provide a signal whose phase is triggered to that of a reference signal. This concerns a voltage-controlled oscillator whose output signal is applied to a phase comparator. The error voltage, possibly provided by said comparator, is filtered by a lowpass filter so as to eliminate its possible fluctuations and applied to the variable element of the oscillator so as to cancel the phase difference.

Therefore, depending on the signals provided by the phase comparator, the role of the load pump is to inject or remove a constant current from the loop filter. In order to achieve this, a load pump is constituted by a block introducing a current source of the current mirror type and more particularly a first current source is found to generate a negative current so that the outgoing current is controlled according to a symmetrical system. The first source is provided to inject a constant current into the loop filter and the second source is provided to remove a constant current from the loop filter according to the signals provided by the phase comparator. Each source then needs to be constant regardless of the voltage of the loop filter. Thus, this concerns here of being able to provide a constant current whose value is equal to a reference value over the largest possible output voltage range. Now in special operating conditions, a problem is likely to appear. Thus, when the output voltage of the load pump approaches the mains voltage of the load pump (respectively from the ground), the transistor forming the current source which generates a positive current (respectively which generates a negative current) enters a linear state which falsifies the current recopies and the output current is no longer kept at the reference value.

One solution of this problem given by the prior art and described in the European patent application EP 0 778 510 consists of using cascoded current sources. This patent document relates to highly symmetrical bi-directional current sources able to generate equal negative and positive currents over a wide output voltage range. The positive and negative currents generated are moreover rendered equal to a reference current with great precision. This device of the prior art includes a first and a second cascoded current source, each source being coupled to current mirrors so as to apply a constant reference current, respectively a positive and negative reference current, from a minimum output voltage up to a maximum output voltage between the ground of the mains voltage.

Thus, this solution proposes using current sources having a high internal impedance. In fact, an increase of the internal impedance of the current source makes it possible to render the current supplied to be more insensitive to voltage variations at the terminals of the device.

This improvement of the output impedance of the device able to reach the objective in question, namely the application of a constant reference current, either positive or negative, is thus obtained by means of using cascoded current sources.

However, the use of cascoded sources requires working with greater mains voltages with respect to the use of single sources. These cascoded sources in fact make use of two transistors instead of a single one and, according to the document of the prior art, the minimum mains voltage to be applied is three volts. Thus, this requirement of the prior art prevents functioning with small mains voltages. In fact, in this case, a low mains voltage less than said mains voltage would result in a bad recopy of the currents since it is then not possible to place the transistors in a good working condition, namely the saturated state which is characterised by a sufficiently high drain source voltage.

Other solutions not implementing cascoded current sources are also currently known. However, in these solutions, adapting the current source between the positive current source and the negative current source is not taken into account. This phenomenon concerning adapting the current between the positive source and the negative source thus generates significant interference in the output frequency of the oscillator in controlled operational mode.

SUMMARY OF THE INVENTION

Consequently, the aim of the present invention is to overcome the above-mentioned drawbacks of the prior art and therefore proposes providing a load pump able to operate with a wide output voltage range so as to supply a constant current which is respectively positive and negative over the entire output voltage range and whose value is made equal to the value of a reference current so as to maximise the adjustment range of the oscillator voltage-controlled from a controlled-phase loop.

To this effect, the invention seeks to provide inside the load pump a voltage comparator so as to activate (and respectively deactivate it when not required) a system formed by an operational amplifier enabling the output current of the load pump to forcibly reach the predetermined reference value.

More specifically, it has already been observed that when the output voltage of the load pump draws close to the feed voltage (respectively of the ground), the transistor of the current source generating a positive (respectively negative) current goes into linear state and therefore falsifies the current recopies.

A first operational amplifier (respectively a second) associated with a first comparator (respectively a second) will then makes it possible to force the mirror transistor of the current source generating a positive (respectively negative) current into an operational state similar to that of the transistor of the current source, namely into linear state, so as to recover the current mirror and keep the output current at the reference value.

Thus, this involves setting up of a symmetrical switching system which activates either of the operational amplifiers respectively associated with either of the positive or negative current sources according to predetermined threshold values, one of the amplifiers then being provided so as to restore the behaviour of the current mirror generating a positive current when the output voltage of the load pump draws close to the feed voltage and the other then being provided to restore the behaviour of the current mirror generating a negative current when the output voltage of the load pump approaches the ground so that the output current of the load pump is still constant and equal to a reference value over the widest possible output voltage range.

The solution makes it possible to obtain a wider output voltage range than with cascoded sources by accurately controlling the output voltage of the transistor tilting into linear mode respectively for the source generating a positive current (known as the "high" current source) and for the source generating a negative current (known as the "low" current source).

The solution also makes it possible to limit the phenomenon of maladjustment likely to occur at low and high output voltages between the "high" current source and the "low" current source and thus make it possible to limit interference to the reference frequency at the output of the voltage-controlled oscillator in the automatic controlled operational mode by means of using a fully symmetrical switching system.

Thus, the invention concerns a load pump polarised between a feed voltage and the ground and comprising a first current source associated with a transistor for recopying the mirror current and a second current source associated with a transistor for recopying the mirror current, said first and second current sources supplying a respectively positive and negative reference current on an output voltage range of said load pump ranging from a minimum output voltage to a maximum output voltage between the ground and the feed voltage, said load pump being characterised in that it further includes a first operational amplifier and a second operational amplifier, said first amplifier being activated and then respectively deactivated by a first comparator when the output voltage of said load pump becomes greater and then respectively smaller than a predetermined threshold value to force said mirror transistor associated with said first current source to a linear operational state which is then respectively saturated.

Said second amplifier is activated and then respectively deactivated by a second comparator when the output voltage of said load pump is smaller and then respectively greater than said predetermined value so as to force said mirror transistor associated with said second current source to a linear operational state which is then saturated.

Other characteristics and advantages of the invention shall appear more clearly on reading the following description given by way of illustration and non-restrictive example with reference to the sole accompanying figure:

FIG. 1 which is a diagram illustrating the load pump device according to the invention.

FIG. 1 thus describes a load pump according to the invention which more specifically consists of a bidirectional current source polarised between the feed voltage VDD and the ground GND. The bidirectional current source forming the load pump is embodied according to the CMOS ("Complementary Metal Oxide Semiconductor") technique.

The load pump comprises a first branch formed by a type P diode-mounted MOS transistor M9, a current feed 1 generating a reference current Iref and a type N diode-mounted MOS transistor, all connected in series.

A second branch is formed by a first MOS transistor M8, a second MOS transistor M11 with an intermediate node 2 between them and a third MOS transistor M2 for recopying the current, all being connected in series. The transistor M2 is mirrored with a MOS transistor MI forming the positive current source.

Thus, the source of the transistor MB is connected to the ground GND and its control grid is connected to the control grid of the diode-mounted MOS transistor M10 of the first branch. The source of the transistor M2 is connected to the feed voltage VDD and its drain is connected to the source of the transistor M11. The drains of the transistors M8 and M11 are interconnected with the intermediate node 2 between them. The control grid of the transistor M11 is polarised, either to the feed voltage VDD or to the ground GND.

A third branch is formed by a first MOS transistor M7, a second MOS transistor M12 with an intermediate node 3 between them, and a third MOS transistor M4 for recopying the current, all connected in series. The transistor M4 is mirrored with a MOS transistor M3 forming the negative current source. Thus, the source M7 is connected to the feed voltage VDD and its control grid is connected to the control grid of the diode-mounted MOS transistor M9 of the first branch. The source of the transistor for recopying the current M4 is connected to the ground GND and its drain is connected to the source M12. The drains of the transistors M12 and M7 are interconnected with the intermediate node 3 between them. The grid M12 is either polarised to the feed voltage VDD or to the ground.

A fourth branch or output branch is constituted by a first MOS transistor M1 whose source is connected to the feed voltage VDD and whose control grid is connected to the control grid of current-recopying MOS transistor M2 of the second branch, thus forming a current mirror so as to recopy the reference current Iref onto its drain where a positive current I is generated at a first common node 4. The transistor M1 is thus used as a positive current source.

The fourth branch comprises also a second MOS transistor M3 whose source is connected to the ground and whose control grid is connected to the control grid of the current-recopying MOS transistor M4 so as to recopy the reference current Iref onto its drain where a negative current I− is generated at a second common node 5. The transistor N3 is thus used as a negative current.

A switching device SW comprises a first pair of additional MOS transistors M13 and M14 forming a first sub-branch and a second pair of additional MOS transistors M15 and M16 forming a second sub-branch, interconnected by a node 7 which is used as an output node of the load pump towards a loop filter and a voltage-controlled oscillator. The two sub-branches are connected in parallel between the two common nodes 4 and 5. The pairs of additional transistors are controlled by control signals respectively UP, DNN and UPN DN, so as to select either the positive current I+ or the negative current I− which needs to be provided by the load pump to the output node 7.

The load pump includes also a first operational amplifier AOPI whose negative input is connected to the output node 7 of the load pump, whose positive input is connected to the intermediate node of the second branch and whose output is placed at the same potential than the grid of the positive current source M1.

The operational amplifier AOPI is activated (respectively deactivated) by means of a first comparator COMP1 and a MOS transistor M5 used as a reversing switch.

The load pump also includes a second operational amplifier AOP2 whose negative input is connected to the output node 7 of the load pump, its positive input being connected to the intermediate node 3 of the third branch and whose output is placed at the same potential as the control grid of the negative current source M3.

The amplifier AOP2 is activated (respectively deactivated) by means of a second comparator COMP2 and a MOS transistor M6 used as a reversing switch.

The load pump of the invention thus includes a first current mirror circuit constituted by the diode-mounted MOS transistor M10, the MOS transistor M8, the MOS transistor M2 and the MOS transistor M1 which recopies the reference current Iref so as to secure the positive current I+ to the drain of the MOS transistor M1 so that I+=Iref.

A second current mirror, constituted by the diode-mounted MOS transistor M9, the MOS transistor M7, the MOS transistor M4 and the MOS transistor M3, recopies the reference current Iref so as to secure the negative current I– to the drain of the MOS transistor M3 so that I–=Iref.

The first current source M1 connected to the current recopying transistor M2 thus makes it possible to apply to the outlet node 7 of the load pump the constant reference current Iref as positive and the second current source M3 connected to the current-recopying transistor M4 makes it possible to apply to the outlet node 7 the constant reference current Iref as negative.

It is important to note that it is the loop filter at the outlet (not shown) which requires the potential of the outlet node 7 of the load pump.

Let us take an example of the functioning of the load pump of the invention with the "low" current source, namely the negative current source M3. The current I– is then withdrawn from the loop filter. In these circumstances, the transistor M16 used as a reversing switch is rendered passing by applying the signal DN equivalent to the mains voltage Vdd on its control grid.

As the system described is completely symmetrical, a description similar to the one which follows can be made for the "top" current source, namely the positive current source M1.

Thus, when the output voltage is low (close to the ground), the drain/source voltage of the transistor M3 becomes lower than the saturation voltage and the transistor M3 tilts into a linear operating state. As the current recopying transistor M4 is in a saturated state, recopying of the current Iref is then falsified. Without the mechanism implemented by the invention via the action of the comparator COMP2 and of the associated operational amplifier AOP2, the current circulating through the negative current source M3 would rapidly reduce and then be dependent on the drain-source voltage of M3.

The aim is then to restore the current mirror between the reference transistor M4 and the current source M3 by forcing the transistor M4 into the same state as M3, namely by forcing M4 to tilt into the linear functioning state. The control grid, source and drain potentials of M4 and M3 thus need to be rendered identical, which is precisely the role of the operational amplifier AOP2.

The drain potential of M4 thus needs to be controlled at the potential of the common node 5 which boils down to controlling the potential of the intermediate node 3 of the third branch with the potential of the outlet node 7 of the load pump when the transistor M12, advantageously tailored identically to the transistor M16 used as a reversing switch rendered passing, is controlled by the control grid voltage Vdd. This automatic control is effected by the operational amplifier AOP2 which is activated by the comparator COMP2 when the output voltage of the load pump passes below a certain predetermined threshold value which may be taken as equal to VDD/2.

In fact, COMP2 receives on its input the output voltage of the load pump and a reference voltage Vref2 equal to the predetermined threshold value is applied to its input+. COMP2 then activates AOP2 when the output voltage becomes lower than the threshold value Vref2 and the operational amplifier AOP2 then acts on its output so as to impose on its + input connected to the node 3 the potential of its – input connected to the output node 7.

The operational amplifier AOP2 this makes it possible to keep both the same grid/source voltage and drain/source voltage for the reference transistor M4 and the current source transistor M3 when the output voltage of the load pump goes below a certain predetermined threshold value. These two transistors are then in the same linear operating state and the output current I– is constant and equal to Iref. The load pump is thus able to work optimally at low output voltage with transistors which are desaturated as a mechanism is available to ensure a proper recopying of the reference current whilst keeping the current source M3 and its mirror M4 in the same state.

When the output voltage becomes greater than the threshold value Vref2, the comparator COMP2 deactivates the amplifier AOP2 and renders passing the transistor M6 used as a reversing switch. In this way, the comparator COMP2 is able to ensure that the transistor M7 remains correctly saturated when the output voltage of the load pump is high.

The drain-source current of M7 is then equal to the reference current irrespective of the output voltage of the load pump.

A functioning similar to the one described above is embodied with the comparator COMP1 and the operational amplifier AOP1 as regards the "upper" current source, namely the positive current source M1. In this case, the comparator COMP1 activates the operational amplifier AOP1 when the output voltage of the load pump becomes greater than a reference voltage Vref1 equal to a predetermined threshold value, for example VDD/2. In fact, when the output voltage of the load pump is high (close to VDD), the transistor M1 tilts into a linear state and the amplifier AOP1 the makes it possible to force the functioning of the transistor M7 for recopying the mirror current into the same state.

The load pump of the invention makes it possible to obtain a constant reference current, respectively positive and negative, on a wider output voltage range than with the prior art as it is possible to work with desaturated transistors. Thus, simulation results have shown that it is possible to provide a constant current over an entire output voltage range between a minimum output voltage corresponding to the ground plus 200 mv (millivolts) and a maximum output voltage corresponding to the mains voltage of less than 200 mv. The possibility of having a constant current at the output of the load pump on a wider output voltage range makes it possible to pilot the voltage-controlled oscillator placed behind the load pump over a wider voltage range and therefore makes it possible to increase the frequency variation range at the outlet of the oscillator.

In addition, the invention uses a perfectly symmetrical switching system which activates either of the operational amplifiers AOP1 or AOP2 according to predetermined threshold values. Thus, with this system, the mismatching phenomenon between the positive current source M1 and the negative current source M3 is reduced when the loop is locked and the reduction of the adapting defect between the sources M1 and M3 makes it possible to reduce interference in the reference frequency measured at the outlet of the oscillator.

Finally, the load pump of the invention is able to lower the mains voltage to 2.5 V (volts) since the current sources used are not cascoded sources.

What is claimed is:

1. Load pump polarised between a supply voltage and the ground and including a first current source associated with a mirror current recopying transistor and a second current source associated with a mirror current recopying transistor, said first and second current sources providing a constant reference current, respectively positive and negative over an output voltage range of said load pump ranging from a minimum output voltage up to a maximum output voltage between the ground and the supply voltage said load pump being characterised in that it further includes a first operational amplifier and a second operational amplifier, said first amplifier being activated and then respectively deactivated by a first comparator when the output voltage of said load pump becomes respectively lower and then higher than a predetermined threshold value so as to force said mirror transistor associated with said first current source into a respectively linear and then saturated operating condition, said second amplifier being activated and then deactivated by a second comparator when the output voltage of said load pump becomes lower and then higher than said predetermined threshold value so as to force said mirror transistor associated with said second current source into a linear and then saturated operating condition.

2. Load pump according to claim 1, wherein the predetermined threshold value of the output voltage of said load pump is taken as equal to the value of the supply voltage divided by two.

3. Load pump according to claim 1, characterised in that it further includes a switching device including a first pair of MOS additional transistors placed in parallel with a second pair of MOS additional transistors, said pairs of additional transistors being controlled by control signals so as to select either the positive current or the negative current needing to be provided at the outlet by said load pump.

4. Load pump according to claim 3, characterised in that the predetermined threshold value of the output voltage of said load pump is taken as equal to the value of the supply voltage divided by two.

5. Controlled phase loop including a loop filter and a voltage-controlled oscillator, characterised in that it implements the load pump according to claim 1 upstream of the unit constituted by said filter and said oscillator.

* * * * *